CODE Fig. 1a. Fig. 1b.

INVENTORS
LEONARD A. KAPLAN &
OLIVER P. HART
BY William H. Meagher
ATTORNEY

INVENTORS
LEONARD A. KAPLAN &
OLIVER P. HART
BY William H. Meagher
ATTORNEY

Dec. 2, 1969 L. A. KAPLAN ET AL 3,482,167

AUTOMATIC GAIN CONTROL SYSTEM EMPLOYING MULTIPLE INSULATED GATE FIELD EFFECT TRANSISTOR

Filed June 12, 1967 3 Sheets-Sheet 3

INVENTORS
LEONARD A. KAPLAN &
OLIVER P. HART
BY William H. Meagher
ATTORNEY

United States Patent Office 3,482,167
Patented Dec. 2, 1969

3,482,167

AUTOMATIC GAIN CONTROL SYSTEM EMPLOYING MULTIPLE INSULATED GATE FIELD EFFECT TRANSISTOR

Leonard A. Kaplan, Fords, and Oliver P. Hart, Berkeley Heights, N.J., assignors to RCA Corporation, a corporation of Delaware Filed June 12, 1967, Ser. No. 645,452
Int. Cl. H04b *1/16*
U.S. Cl. 325—404 9 Claims

ABSTRACT OF THE DISCLOSURE

An automatic gain control system including a field-effect transistor of the type having two or more insulated gate electrodes. Control voltages over a first range applied to the second gate electrode have substantially no effect on the amplification of signals applied to the first gate electrode while control voltages over a second and different range applied to the second gate electrode effect an attenuation in the signal gain provided.

Figure 1A:
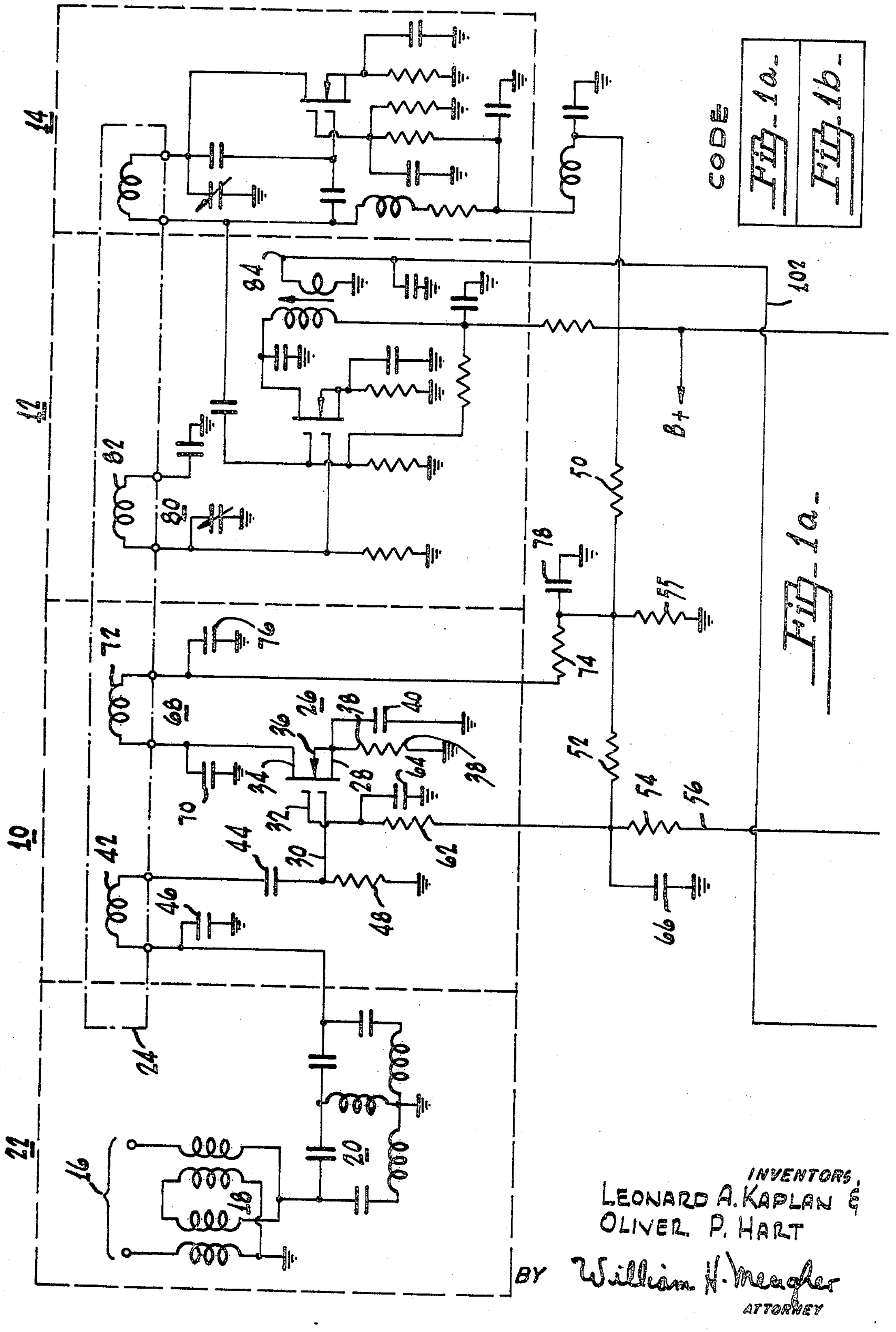

This invention relates to gain control circuits and more particularly to automatic gain control circuits suitable for use in signal receivers employing multiple gate field-effect transistors as the active elements thereof.

Signal receivers are generally provided with an automatic gain control (AGC) system for maintaining the level of the signal applied to a detector stage thereof substantially constant over a relatively wide range of variations in the level of the received signal. In a television receiver, for example, the AGC system operates to reduce the gain of the radio frequency (R.F.) and intermediate frequency (I.F.) amplifiers as the received signal increases. To obtain the best signal-to-noise ratio for a given receiver for the weakest signals to be received the gain control action on the R.F. amplifier is usually delayed so that the R.F. amplifier operates at full gain for a range of received signals of low level. When the signal level increases sufficiently, the AGC delay on the R.F. amplifier is overcome and the gain of both the R.F. and I.F. amplifiers is reduced.

Multiple gate field-effect transistors have two or more gate electrodes in addition to the source, drain and substrate electrodes. These transistors have attractive characteristics which appear to be promising for many circuit applications. Some of these characteristics are: (1) high input impedance, (2) low cross-modulation, (3) low noise, and (4) simplified direct coupling capability.

In using a multiple gate field-effect transistor as a gain controlled radio frequency (R.F.) or intermediate frequency (I.F.) amplifier, it is desirable to apply the R.F. or I.F. signal to the first gate electrode and the AGC voltage to the second gate electrode. It will be understood that the first gate electrode is physically closer to the source electrode than the second gate electrode. Characteristic of the multiple insulated gate field-effect transistor operated as such, is a range of applied control voltages to the second gate electrode over which the device exhibits a region of nearly constant gain from the first gate electrode to the drain electrode.

With the second gate electrode of the insulated gate field-effect transistor biased in a polarity direction to provide maximum gain, it has been found that the device exhibits a region of nearly constant gain as the voltage applied to the second gate electrode is further increased in said polarity direction. Over this region, the transconductance ($g_{m2}$) of the second gate to the drain electrode is substantially zero, and does not substantially affect the transconductance ($g_{m1}$) of the first gate electrode.

It is an object of the present invention to provide an improved automatic gain control system.

It is another object of the present invention to take advantage of the second gate transconductance characteristic of a multiple insulated gate field-effect transistor and provide in an amplifier stage employing said transistor as the active element thereof, a delayed automatic gain control system.

Another object of the present invention is to provide an improved automatic gain control system for radio signal receivers that includes a delayed gain control type of action on a radio frequency amplifier stage.

A further object of the present invention is to provide an improved automatic gain control system for radio signal receivers where a plurality of cascaded multiple insulated gate field-effect transistor stages are conjointly controlled from a common automatic gain control source to provide controllable gain changes in each of the plurality of transistor stages.

A still further object of the present invention is to provide an improved automatic gain control system for a television receiver where the frequency response curve of the receiver I.F. section is shifted under weak signal conditions to favor the video I.F. carrier frequency.

A circuit embodying the invention includes a plurality of signal amplifying stages having automatic gain control voltage input circuits, said stages being arranged for successively processing a received signal. One of the stages includes a dual insulated gate field-effect transistor connected in common source amplifier configuration with the stage control voltage input circuit coupled to the transistor second gate control electrode and wherein the gain versus second gate electrode voltage characteristic is such that over a first range of second gate electrode voltages the gain of the transistor amplifier is substantially constant, and over a second range of second gate electrode voltages the gain of the transistor amplifier decreases. The transistor is initially biased such that the voltage at the second gate electrode is in the first range of said gate electrode voltages. Circuit means are provided for coupling to said input circuits a gain control voltage which increases in a predetermined direction in response to an increase in the level of a received signal thereby to maintain the gain of said transistor amplifier substantially constant and automatically effect a decrease in the gain of the other of said amplifying stages in response to an increase in said gain control voltage of a magnitude such that the voltage at said second gate electrode is kept within said first voltage range, and to decrease the gain of said transistor amplifier in response to a further increase in the gain control voltage of a magnitude such that the voltage at the second gate electrode is brought within said second voltage range.

The delayed automatic gain control system of the invention will be described in the context of a television receiver. It is to be understood, however, that the fundamental concepts to be described are more generally applicable. For example, the system may be used in broadcast or communication receivers.

Figure 1B:
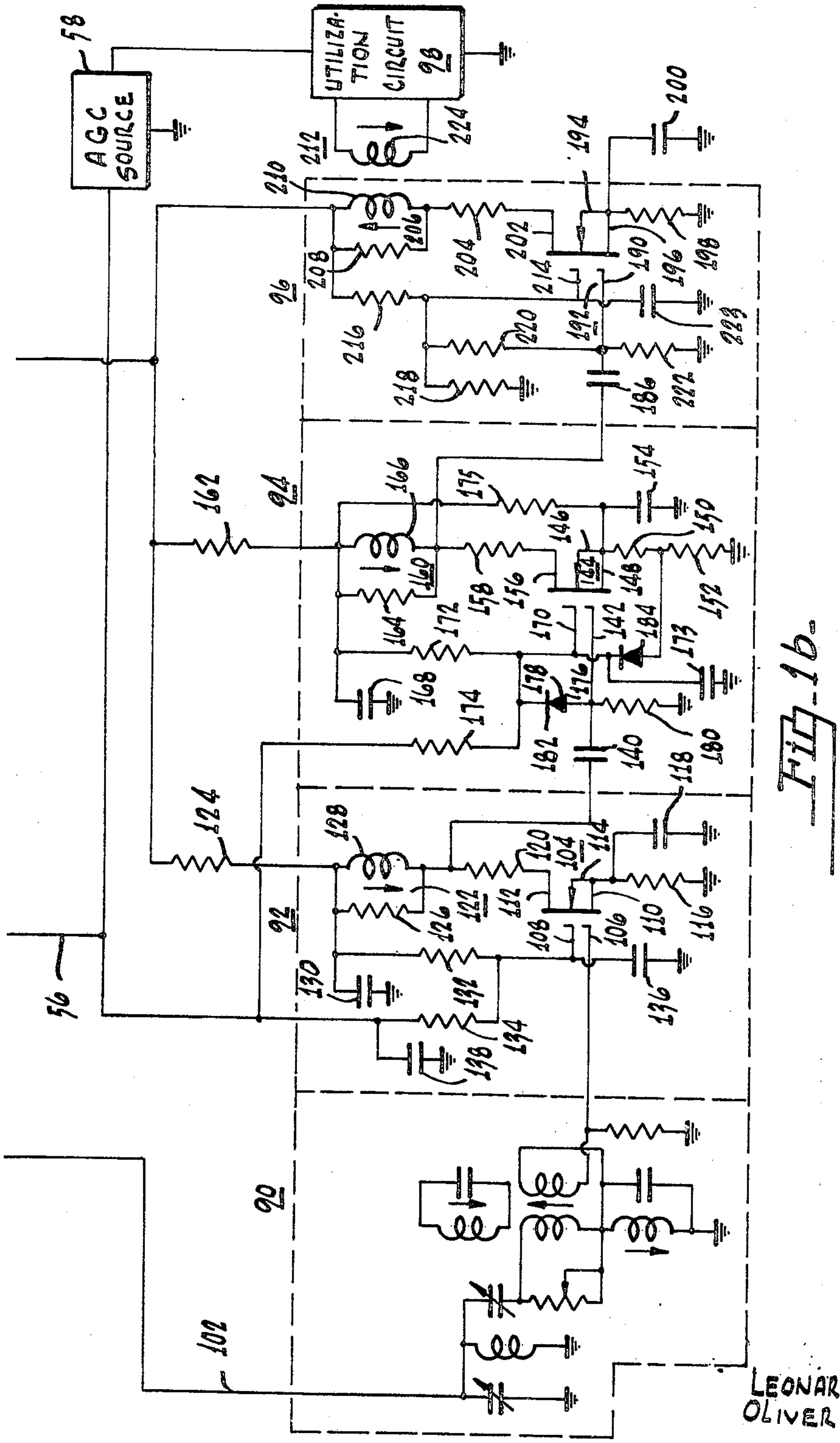
Figure 2:
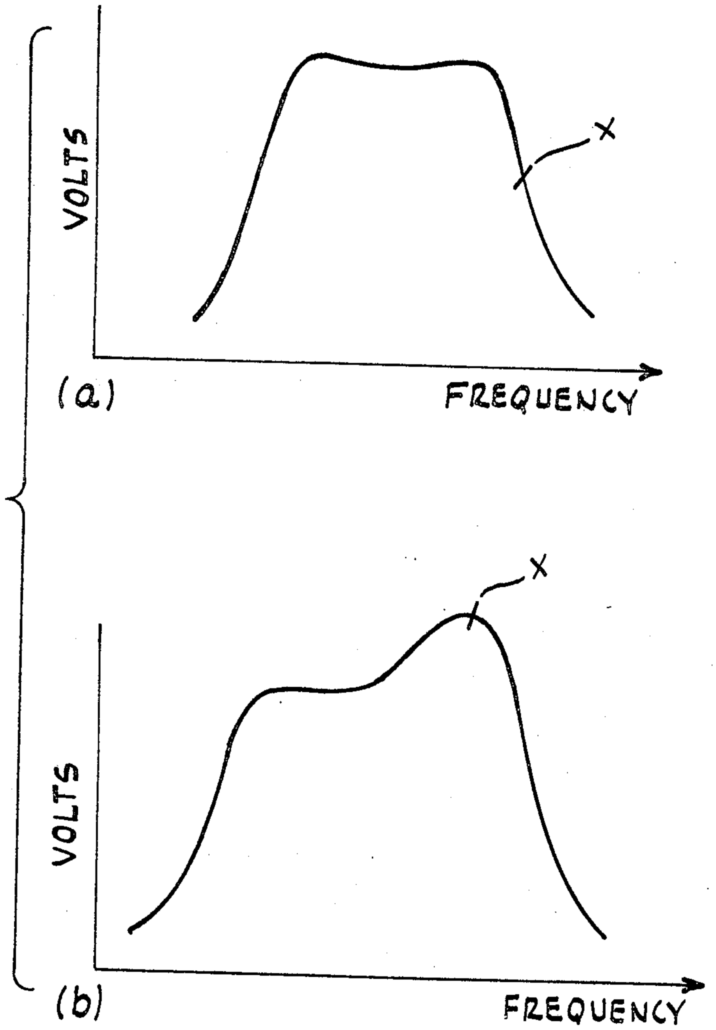

The novel features that are considered characteristic of the invention are set forth with particularity in the appended claims. The invention itself, however, both as to its organization and method of operation as well as additional objects and advantages thereof, will best be understood from the following description when read in connection with the accompanying drawings in which:

FIGURES 1*a* and 1*b* are schematic circuit diagrams partially in block form of the front end of a television receiver including the tuner, and I.F. stages thereof and embodying the present invention; and FIGURES 2*a* and 2*b* illustrate the overall bandpass response characteristic of the receiver I.F. amplifier section under minimum and maximum gain conditions respectively.

Referring now to the drawings, and particularly to FIGURE 1*a*, the circuits shown therein are representative of the radio frequency (R.F.) amplifier 10, mixer 12 and oscillator 14 stages generally comprising the tuner of a television receiver. A pair of input terminals 16 which are adapted for connection to an antenna (not shown) to receive a television signal, are also connected to the unbalanced input circuit of the R.F. amplifier 10 through a balun transformer 18 and trap network 20, all of which are indicated by the dashed rectangle 22. The trap network 20 is coupled to a tuning selector 24 which will be understood by those familiar with the art to include a switching system for a plurality of reactive elements for tuning the receiver to the different TV channels on which reception is desired. The tuning selector 24 includes four different tuning circuit portions, only representative ones being shown, for tuning the input and output of the R.F. amplifier 10, the input of the mixer 12 and the local oscillator 14.

The R.F. amplifier 10 includes an insulated gate field-effect transistor 26 having source, first gate, second gate and drain electrodes 28, 30, 32 and 34 respectively and a substrate electrode 36. In the illustrated embodiment, the field-effect transistor 26 is of a type referred to as an N-channel insulated dual gate transistor.

Transistor 26 is connected in common source configuration with the substrate electrode 36 connected to the source electrode 28 and the source electrode connected to ground through a source resistor 38. Resistor 38 is bypassed to ground for signal frequencies through a capacitor 40. A received television signal appearing at the output terminals of the trap network 20 is coupled through a tuning inductor 42 in the selector 24 and a capacitor 44 to the input first gate electrode 30 of the transistor 26. The inductor 42 is tuned to resonate with a capacitor 46 and the circuit stray capacitance and input capacitance of the transistor 26 at the desired signal frequency. The first gate electrode 30 is connected to ground through a resistor 48. A voltage divider network for establishing the bias of the second gate electrode 32 of the transistor 26 includes resistors 50, 52 and 54 which are respectively connected between a source of energizing potential (designated by the terminal B+) and an AGC lead 56, and a resistor 55 connected between ground and the junction of resistors 50 and 52. The AGC lead 56 is DC returned to ground through an AGC source 58 (FIGURE 1*b*). As will be hereinafter described, the resistor 54 is also used to set the automatic gain control delay in the R.F. amplifier 10 and couple an AGC voltage thereto. An isolation resistor 62 is connected between the second gate electrode 32 of the transistor 26 and the junction of resistors 52 and 54. R.F. signal bypass is provided by capacitors 64 and 66 connected between ground and the respective end terminals of resistor 62.

Signals which are amplified by the R.F. amplifier 10 are developed in a parallel resonant output circuit 68 effectively connected between the drain electrode 34 and ground and tunable to the frequency of a desired signal to be received. The output circuit 68 includes a capacitor 70 effectively in parallel with an inductor 72 of the selector 24. B+ operating potential is supplied to transistor 26 drain electrode 34 through a signal decoupling resistor 74 connected between one end of the inductor 72 and the junction of resistors 50 and 52 in the B+ voltage divider network. The inductor 72 is returned to ground through a signal bypass capacitor 76. A signal bypass capacitor 78 is also connected between ground and the junction of resistors 50 and 52.

Signals from the R.F. amplifier output circuit 68 are inductively coupled to the signal input circuit 80 of the mixer stage 12. The input circuit 80 includes an inductor

82 of the selector 24 and which is also tunable to the frequency of a signal to be received. The mixer 12 operates in conjunction with the local oscillator 14 to produce a corresponding intermediate frequency signal at the output thereof indicated at terminal 84, in response to an applied television signal from the radio frequency amplifier 10.

Referring now to FIGURE 1*b*, the schematic circuit diagrams illustrated therein are representative of the "link" circuit 90, first, second and third video I.F. amplifier stages 92, 94 and 96, utilization circuits indicated by the block 98, and an AGC source 58.

The resultant intermediate frequency signal is coupled from the output of the mixer 12 (FIGURE 1*a*) by way of lead 102 to the input of a bandpass interstage coupling network 90 (link circuit) which includes suitable traps for undesired signals and which precedes the first intermediate frequency amplifier 92. The amplifier 92 includes a field-effect N-channel insulated dual gate transistor 104 having first and second gate electrodes 106 and 108, a source electrode 118, a drain electrode 112 and substrate electrode 114.

Transistor 104 is connected in common source configuration with the substrate electrode 114 connected to the source electrode 110. The source electrode 110 is connected to ground through a resistor 116 which is bypassed to ground at signal frequencies by a capacitor 118. Connection is made from the output of the trap network 90 to the first gate electrode 106 for application of the intermediate frequency signal to be amplified to the input of the first I.F. amplifier 92. The drain electrode 112 of the transistor 104 is connected through a resistor 120 in series with an output load network 122 and decoupling resistor 124 to a source of fixed operating potential B+. Network 122 includes a resistor 126 in parallel with an inductor 128. The end of the inductor 128 remote from the resistor 120 is coupled to ground for signal frequencies by a capacitor 130. The inductor 128 is tuned to resonate with the stray circuit capacitance, the output capacitance of transistor 104 and the input capacitance of the succeeding transistor 144. Bias and coupling of an AGC voltage to the second gate electrode 108 of the transistor 104 is established by connection of the gate electrode 108 to the junction of resistors 132 and 134 which are series connected between the AGC lead 56 and the junction of resistor 124 and the network 122. The second gate electrode is also coupled to ground through a signal bypass capacitor 136. As was heretofore mentioned, the AGC lead 56 is DC returned to ground through the AGC source 58. As signal frequencies the AGC lead 56 is coupled to ground through a bypass capacitor 138.

The amplified intermediate frequency signal developed in the output load network 122 is coupled via a capacitor 140 to the input first gate electrode 142 of a field-effect N-channel insulated dual gate transistor 144 connected in common source amplifier configuration in the second video I.F. amplifier 94. The substrate electrode 146 of the transistor 144 is connected to the source electrode 148 and then to ground via series connected source resistors 150 and 152. Resistors 150 and 152 are bypassed to ground at signal frequencies by a capacitor 154. The drain electrode 156 is connected through a resistor 158 in series with an output load network 160 and decoupling resistor 162 to the B+ terminal. Network 160 includes a resistor 164 in parallel with an inductor 166. The end of the inductor remote from the resistor 158 is coupled to ground for signal frequencies by a capacitor 168. The inductor 166 is tuned to resonate with the stray circuit capacitance, input capacitance of the succeeding transistor 192, and the output capacitance of the transistor 144. Bias and coupling of an AGC voltage to the second gate electrode 170 of the transistor 144 is established by connection of the gate electrode 170 to the junction of resistors 172 and 174 which are series connected between the AGC lead 56 and the junction of resistor 162 and the network 160. A signal bypass capacitor 173 is connected between the second gate electrode 170 and ground. A resistor 175 is connected between the source electrode 148 and the junction of resistor 162 and network 160 to supply current to the source resistors 150 and 152 and maintain a given first gate-to-source voltage. The anode 176 of a diode 178 is connected to the first gate electrode 142 of the transistor 144 and the first gate electrode 142 is connected to ground via a resistor 180. The diode cathode 182 is connected to the second gate electrode 170. As will be hereinafter described, the diode 178 acts as an AGC variable capacitance in shunt with the input capacitance of the first gate electrode 142 of the transistor 144. A second diode 184 is connected between the second gate electrode 170 and the junction of source resistors 150 and 152, the poling of diode 184 is such that its cathode is connected to the second gate electrode 170.

The amplified intermediate frequency signal developed in the output load network 160 is coupled via a capacitor 186 to the input first gate electrode 190 of a field-effect N-channel insulated dual gate transistor 192 in the third video I.F. amplifier 96. The transistor 192 is connected in common source configuration with the substrate electrode 194 connected to the source electrode 196. The source electrode 196 is connected to ground through a resistor 198. Resistor 198 is bypassed to ground at signal frequencies by a capacitor 200. The drain electrode 202 is connected via a resistor 204 in series with an output load network 206 to the B+ terminal. Network 206 includes a resistor 208 in parallel with the primary winding 210 of a signal coupling transformer 212. Bias to the second gate electrode 214 of the transistor 192 is by connection of the second gate electrode 214 to the junction of resistors 216 and 218 which are series connected between the B+ terminal and ground. A resistor 220 is connected between the first and second gate electrodes 190 and 214 and a resistor 222 is connected between the first gate electrode and ground. A bypass capacitor 223 is connected between the second gate electrode 214 and ground. In the illustrated embodiment no AGC is applied to the third I.F. amplifier.

The amplified intermediate frequency signal developed across the primary winding 210 of the transistor 192 load network 206 is coupled via the secondary winding 224 of the transformer 212 to the desired utilization circuits indicated by block 98 and which may include the remaining circuits of a television receiver. In any case, the utilization circuits include means (depicted as source block 58) for developing an automatic gain control signal as a function of a received signal level.

In the present case, the automatic gain control developing circuit provides a negative voltage at an AGC lead terminal 56 which tends to become more negative with increases in signal level.

Referring now to FIGURES 1*a* and 1*b*, the operation of the gain controlled amplifier stages shown therein will now be described.

It has been observed that with the second gate electrode of an insulated gate field-effect transistor biased in a polarity direction to provide maximum gain, the device exhibits a region of nearly constant gain as the voltage applied to the second gate electrode is further increased in said polarity direction. Over this region, the transconductance ($g_{m_2}$) of the second gate electrode to the drain electrode is substantially zero and there is no effective change in the transconductance ($g_{m_1}$) of the first gate electrode. For example, for an RCA experimental type TA7149 dual gate MOS transistor, this region of zero $g_{m_2}$ has been found to occur in the area of from +2 to +10 volts DC for television R.F. frequencies and from +4 to +10 volts DC for television I.F. frequencies. Using the TA7149 as the active element in the R.F. amplifier shown in FIGURE 1*a*, and with no AGC voltage applied, i.e. the AGC source lead 56 grounded, suitable values for the operating B+ potential, source resistor 38, and divider resistors 50, 55, 52 and 54 can be chosen to bias the amplifier for maximum gain with the second gate electrode at a potential of approximately +8 volts DC. Correspondingly, using an RCA experimental type TA7149 dual gate MOS transistor as the active element in the first and second I.F. amplifier stages 92 and 94 to be AGC'd (FIG. 1*b*), the transistors 104 and 144 are biased for maximum gain with the respective second gate electrode 108 and 170 each at a potential of +4 volts DC. Now with the AGC lead 56 ungrounded and under weak signal (low level) conditions, the R.F. amplifier 10 and I.F. amplifiers 92 and 94 will normally be operating at maximum gain with little or zero AGC voltage fed back from the AGC source 58. As the applied AGC is increased, i.e. made negative, responsive to an increase in the level of a received television signal, the resultant DC bias voltage on the second gate electrodes of the transistors 32, 108 and 170 in the respective R.F. first I.F. and second I.F. amplifier stages 10, 92, and 94 correspondingly decreases. With a decrease in the second gate electrodes bias potential, the gain of the first and second I.F. amplifier stages 92 and 94 starts to drop rapidly and follows a normal AGC action. The R.F. amplifier stage 10 meanwhile maintains its gain fairly constant since the bias voltage on the second gate electrode 32 of the R.F. transistor 26 was higher from the start. In the given example, at television radio frequencies, gain reduction in the R.F. amplifier will not be initiated until the AGC voltage causes the potential at the second gate control electrode 32 to drop below +2 volts. It will be apparent that in the present system, under the influence of a common AGC voltage, a substantial amount of gain reduction can be achieved in the I.F. amplifier stages before the R.F. amplifier gain begins to fall. The amount of delay imparted to the AGC of the R.F. amplifier stage can be varied from zero at one extreme, to complete delay at the other extreme, by simply changing the initial bias potential at the second gate control electrode.

In the first and second I.F. amplifier stages 92 and 94 illustrated in FIGURE 1*b*, the value of the source resistor 116 in the first I.F. amplifier 92 is chosen to be greater (in the order of 100 ohms) than that of the series connected source resistors 150 and 152 (total resistance in the order of 50 ohms) in the second I.F. amplifier 94.

With no AGC voltage applied, both the first and second I.F. amplifier stages 92 and 94 operate at nearly identical conditions for maximum gain. In response to an applied AGC voltage to the amplifier stages second gate electrodes, the second I.F. amplifier 94 drain-to-source current and transconductance decreases at a faster rate than that of the first I.F. amplifier 92; thereby dropping the gain of the second I.F. amplifier 94 faster than that of the first I.F. amplifier 92. The difference in rate of drain-to-source current decrease between the two I.F. amplifier stages is due to the differing values of source resistance which inject different amounts of DC degeneration in the amplifier stages. In addition, bias on the second I.F. amplifier stage at maximum gain is augmented by a controlled amount of current fed into the source resistor 150 via the resistor 175 connected between the source electrode 148 of the transistor 144 and the B+ decoupling resistor 162.

To prevent the drain-to-source current in the second I.F. stage from going to zero under the influence of the AGC voltage, thereby bringing the output of the second I.F. amplifier to a level below that required to drive the third and final I.F. amplifier 96 to full output, it is desirable to connect a "catcher" diode 184 between the second gate electrode 170 of the second I.F. amplifier transistor 144 and a DC reference point, such as ground or the junction of the source resistors 150 and 152 as shown in FIGURE 1*b*. The DC voltage dropped across the source resistor 152 by the drain-to-source current of the second I.F. transistor 144 provides a reverse bias on the diode 184. The diode 184 will remain reverse biased unless the AGC control voltage on the second gate electrode 170 exceeds in a negative direction the voltage developed across the source resistor 152, whereupon the "catcher" diode 184 will conduct and clamp the second gate electrode 170 to the voltage developed across the source resistor 152. This serves to prevent the AGC control voltage of the transistor 144 second gate electrode 170 from exceeding in a negative direction a predetermined level for maximum AGC signal attenuation that will provide sufficient gain of the second I.F. amplifier to properly drive the third I.F. amplifier to full output. It will be noted that the "catcher" diode 184 also serves to prevent the second electrode 170 voltage from becoming sufficiently negative with respect to the voltage at the first gate electrode voltage 142 to cause the semiconductor diode 182 to conduct. This assures that the diode 182 will remain reverse biased for capacity change effects to be hereinafter described.

Referring now to FIGURE 2*a*, there is illustrated the normal voltage versus frequency characteristic response curve obtained at the output of a television receiver I.F. section. As indicated by X, the response to the I.F. video carrier is approximately down 50 percent from the maximum bandpass response. With the receiver operating under strong signal conditions wherein the overall attenuation of the I.F. amplifiers in the section due to an applied AGC voltage is approximately 10 db and greater, this is a desired response characteristic.

However, under weak signal conditions wherein the I.F. amplifiers are operated from 10 db signal attenuation to maximum gain, it is desirable to shift the overall response of the I.F. section until the output bandpass characteristic is as shown in FIGURE 2*b*. The effect of favoring the video carrier X as shown in FIGURE 2*b* is to emphasize low frequency video, improve sync stability and minimize noise. Now to shift the video carrier X from the top of the response curve (FIG. 2*b*) down the right hand slope of the curve (FIG. 2*a*) as the first 10 db of AGC is applied, it is necessary to shift the response of an I.F. stage or stages down in frequency. This can be accomplished by increasing shunt capacity associated with the output load networks of one of the receiver I.F. stages.

Referring now to FIG. 1*b*, there is shown a semiconductor diode 178 connected between the first and second gate electrodes 142 and 170 of the second I.F. transistor 144. The diode is back biased by the normally positive bias applied to the second gate electrode 170. As the second gate voltage is reduced from its initial bias condition due to an AGC voltage applied thereto, the capacitance of the diode is increased. This increase in capacitance appears in shunt with the input capacitance of the first gate electrode 142, and output load network 122 thereby changing the resonant frequency of the outpu load network 122 of the first I.F. amplifier 92 and causing the passband of the amplifier to shift lower in frequency and producing the alteration of the overall response characteristic of the I.F. section as shown in FIGURE 2*b*.

What is claimed is:

1. An automatic gain control system for radio signal receivers comprising:

an insulated gate field-effect transistor having a source, drain and first and second gate electrodes;

circuit means connecting said transistor electrodes to form a signal translating stage having a signal input circuit and a signal output circuit, said input circuit being adapted to receive an applied signal, said signal translating stage having a gain versus second gate electrode voltage characteristic wherein the gain of said stage is substantially constant over a first range of second gate electrode voltages, and wherein the gain of said stage decreases over a second range of second gate electrode voltages;

means for biasing said transistor in said first range of second gate electrode voltages;

means providing a source of gain control voltage which increases in a predetermined polarity direction in response to increases in the level of a received signal; and circuit means coupling said source of gain control voltage to said transistor second gate electrode to cause the voltage thereon to vary over said first and second ranges respectively in response to increases in the level of signals applied to said input circuit.

2. In a signal receiving system, the combination of:

a plurality of signal amplifying stages having automatic gain control voltage input circuits, said stages being arranged for successively processing a received signal, at least one of said stages including an insulated gate field-effect transistor having source, drain, first gate and second gate electrodes;

means connecting said transistor in a common source amplifier configuration with said one stage control voltage input circuit being connected to said second gate electrode and wherein the transistor gain versus second gate electrode voltage characteristic is such that over a first range of second gate electrode voltages the gain of said transistor amplifier is substantially constant, and over a second range of second gate electrode voltages the gain of said transistor amplifier decreases;

means for biasing said transistor such that the voltage at the second gate electrode is in said first range of second gate electrode voltages;

means providing a source of direct current voltage for controlling the gain of said amplifier stages and which increases in a predetermined polarity direction in response to an increase in the level of a received signal;

means coupling said source of gain control voltage to the gain control input circuits of said amplifying stages for (a) maintaining the gain of said transistor amplifier substantially constant and automatically effecting a decrease in the gain of the other of said amplifying stages in response to an increase in said gain control voltage of a magnitude such that the voltage at said second gate electrode is kept within said first voltage range, and (b) for decreasing the gain of said transistor amplifier in response to a further increase in said gain control voltage of a magnitude such that the voltage at said second gate electrode is brought within said second voltage range, whereby the effected gain attenuation of said transistor amplifier is delayed with respect to the gain attenuation of the other of said amplifier stages in response to an increase in the level of a received signal.

3. The combination as defined in claim 2 wherein said coupling means further provides for effecting a decrease in the gain of the other of said amplifying stages in response to an increase in said gain control voltage of a magnitude such that the voltage at said transistor second gate electrode is brought within said second voltage range.

4. In combination:

a radio frequency amplifier stage including an insulated gate field-effect transistor having a source electrode, drain electrode and first and second gate electrodes, said transistor having a gain versus second gate electrode voltage characteristic exhibiting a region of substantially constant gain over a first range of positive second gate voltages and a region of decreasing gain over a second range of second gate voltages decreasing from and less positive than said first voltage range;

means coupled to said second gate electrode for biasing said transistor in said first voltage range;

means coupled between said first gate and source electrodes providing a signal input circuit for applying an input radio frequency signal;

means coupled between said drain and source electrodes providing a signal output circuit;

means providing a source of gain control voltage which becomes increasingly more negative as the level of said applied input signal increases; and means coupling said gain control voltage to said transistor second gate electrode to cause the voltage thereon to vary over said first and second ranges respectively in response to increases in the level of said applied input signal.

5. The combination defined in claim 4 and further including:

signal translating means coupled to the signal output circuit of said radio frequency amplifier stage for converting a radio frequency signal to a corresponding signal of intermediate frequency;

an intermediate frequency amplifier stage having signal input and output circuits and a gain control voltage input circuit;

means coupling the intermediate frequency output signal of said signal translating means to the input circuit of said intermediate frequency amplifier stage; and means for applying said gain control voltage to the gain control voltage input circuit of said intermediate frequency amplifier to reduce the gain of said amplifier as the level of said applied radio frequency signal increases.

6. The combination defined in claim 5 wherein said intermediate amplifier stage includes:

a second insulated gate field-effect transistor having a source electrode, drain electrode, and first and second gate electrodes;

means connecting said second transistor in common source configuration with said gain control voltage input circuit being coupled to the second gate electrode of said second transistor; and means for biasing said second transistor such that the gain of said transistor is caused to decrease in response to increases in the magnitude of said gain control voltage.

7. The combination defined in claim 6 and further including:

means including a diode coupled to the second gate electrode of said second transistor and biased for limiting the magnitude of said gain control voltage applied thereto to a predetermined level.

8. The combination defined in claim 4 and further including:

signal translating means coupled to the signal output circuit of said radio frequency amplifier stage for converting a radio frequency signal to a corresponding signal of intermediate frequency;

a plurality of intermediate frequency amplifier stages connected in cascade to successively process an intermediate frequency signal coupled thereto from said signal translating means, with one of said amplifier stages being preceded by another of said amplifier stages having an output circuit tuned to a desired frequency passband, said one amplifier stage including a second insulated gate field-effect transistor having a source electrode, drain electrode, and first and second gate electrodes;

means connecting said second transistor in common source configuration and providing a signal input circuit between said first gate and source electrodes;

signal coupling means connected between said second transistor signal input circuit and said other amplifier stage tuned output circuit;

means coupling said gain control voltage to said second transistor second gate electrode;

means for biasing said second transistor such that the gain thereof is caused to decrease in response to increases in the magnitude of said gain control voltage; and a semiconductor diode connected between said second transistor first and second gate electrodes, said diode being poled to be reverse biased by said second gate electrode voltage so as to exhibit a capacitance effectively in shunt with said tuned output circuit, said exhibited capacitance being caused to increase as the magnitude of said gain control voltage increases, thereby shifting said amplifier passband lower in frequency.

9. The combination defined in claim 8 and further including:

means including a second diode coupled to the second gate electrode of said second transistor and biased for limiting the magnitude of said gain control voltage applied thereto to a predetermined level.

References Cited

UNITED STATES PATENTS 3,229,218 1/1966 Sickles et al. ---- 307—304 XR

ROBERT L. GRIFFIN, Primary Examiner

CARL R. VONHELLENS, Assistant Examiner

U.S. Cl. X.R.

307—304; 325—319; 330—38, 130